United States Patent
Ning et al.

(10) Patent No.: US 11,984,190 B2
(45) Date of Patent: May 14, 2024

(54) METHOD AND SYSTEM FOR ADJUSTING MEMORY, AND SEMICONDUCTOR DEVICE

(71) Applicant: CHANGXIN MEMORY TECHNOLOGIES, INC., Hefei (CN)

(72) Inventors: Shu-Liang Ning, Hefei (CN); Jun He, Hefei (CN); Zhan Ying, Hefei (CN); Jie Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 196 days.

(21) Appl. No.: 17/510,453

(22) Filed: Oct. 26, 2021

(65) Prior Publication Data

US 2022/0068321 A1    Mar. 3, 2022

Related U.S. Application Data

(63) Continuation of application No. PCT/CN2021/106060, filed on Jul. 13, 2021.

(30) Foreign Application Priority Data

Aug. 27, 2020    (CN) .......................... 202010880935.9

(51) Int. Cl.
*G11C 7/06* (2006.01)
*G11C 7/04* (2006.01)
(Continued)

(52) U.S. Cl.
CPC ................. *G11C 7/06* (2013.01); *G11C 7/04* (2013.01); *G11C 7/1093* (2013.01);
(Continued)

(58) Field of Classification Search
CPC ........................................................ G11C 7/06
See application file for complete search history.

(56) References Cited

U.S. PATENT DOCUMENTS

| 4,806,801 A | 2/1989 | Argade et al. |
| 5,768,189 A | 6/1998 | Takahashi |

(Continued)

FOREIGN PATENT DOCUMENTS

| CN | 1409288 A | 4/2003 |
| CN | 101004945 A | 7/2007 |

(Continued)

OTHER PUBLICATIONS

US 9,720,625 B1, 08/2017, Amir et al. (withdrawn)
(Continued)

*Primary Examiner* — Min Huang
(74) *Attorney, Agent, or Firm* — COOPER LEGAL GROUP, LLC

(57) ABSTRACT

Embodiments of the disclosure, there is provided a method, a system for adjusting the memory, and a semiconductor device. The method for adjusting the memory includes: acquiring a mapping relationship between a temperature of a transistor, an equivalent width-length ratio of a sense amplifier transistor in a sense amplifier and an actual time at which the data is written into the memory; acquiring a current temperature of the transistor; and adjusting the equivalent width-length ratio, based on the current temperature and the mapping relationship, so that the actual time at which the data is written into the memory corresponding to the adjusted equivalent width-length ratio is within a preset writing time.

20 Claims, 5 Drawing Sheets

(51) Int. Cl.
*G11C 7/10* (2006.01)
*G11C 7/12* (2006.01)
*G11C 8/08* (2006.01)

(52) U.S. Cl.
CPC .............. *G11C 7/1096* (2013.01); *G11C 7/12* (2013.01); *G11C 8/08* (2013.01)

(56) References Cited

U.S. PATENT DOCUMENTS

| | | | |
|---|---|---|---|
| 5,978,941 A * | 11/1999 | Katayama | G11C 29/52 714/721 |
| 6,223,311 B1 | 4/2001 | Katayama | |
| 6,694,460 B2 | 2/2004 | Katayama | |
| 6,754,120 B1 * | 6/2004 | Bellows | G11C 7/1066 365/207 |
| 6,944,057 B1 | 9/2005 | Runnion | |
| 7,196,926 B1 | 3/2007 | Kim | |
| 7,313,044 B2 | 12/2007 | Fuhrmann | |
| 7,379,355 B2 | 5/2008 | Kim | |
| 7,529,145 B2 * | 5/2009 | La Rosa | G11C 7/12 365/189.08 |
| 7,577,014 B2 | 8/2009 | Yamagami | |
| 7,817,460 B2 | 10/2010 | Yamagami | |
| 7,995,414 B2 * | 8/2011 | Ito | G11C 11/406 365/189.011 |
| RE46,110 E | 8/2016 | Kajigaya | |
| 9,484,083 B2 | 11/2016 | Moriwaki | |
| 10,910,030 B2 | 2/2021 | Antonyan et al. | |
| 10,957,365 B2 | 3/2021 | Lovett | |
| 11,037,622 B2 | 6/2021 | Atsumi et al. | |
| 11,158,371 B2 | 10/2021 | Onuki et al. | |
| 2001/0010086 A1 | 7/2001 | Katayama | |
| 2002/0024378 A1 | 2/2002 | Forbes | |
| 2002/0154545 A1 * | 10/2002 | Tanaka | G11C 16/344 365/185.22 |
| 2003/0021161 A1 | 1/2003 | Fifield | |
| 2003/0052843 A1 | 3/2003 | Yamazaki et al. | |
| 2005/0036362 A1 | 2/2005 | Iwata et al. | |
| 2005/0174164 A1 | 8/2005 | Fuhrmann | |
| 2006/0133172 A1 | 6/2006 | Schnabel | |
| 2006/0220689 A1 | 10/2006 | Kang et al. | |
| 2006/0274590 A1 * | 12/2006 | Fujita | G11C 7/065 365/207 |
| 2007/0165474 A1 | 7/2007 | Kim | |
| 2007/0194381 A1 | 8/2007 | Chun | |
| 2007/0206404 A1 | 9/2007 | Yamagami | |
| 2008/0238530 A1 | 10/2008 | Ito et al. | |
| 2009/0245003 A1 | 10/2009 | Ito | |
| 2009/0251947 A1 | 10/2009 | Kajigaya | |
| 2009/0279347 A1 | 11/2009 | Yamagami | |
| 2009/0296453 A1 | 12/2009 | Lee et al. | |
| 2010/0329026 A1 | 12/2010 | Nakamura et al. | |
| 2012/0020169 A1 | 1/2012 | Wang | |
| 2012/0033487 A1 | 2/2012 | Inoue et al. | |
| 2012/0275235 A1 | 11/2012 | Parker | |
| 2014/0092675 A1 | 4/2014 | Wang et al. | |
| 2015/0279449 A1 | 10/2015 | Moriwaki | |
| 2015/0310938 A1 | 10/2015 | Kim et al. | |
| 2016/0118106 A1 | 4/2016 | Yoshimura et al. | |
| 2017/0005641 A1 | 1/2017 | Chhabra | |
| 2017/0278578 A1 | 9/2017 | Nagai et al. | |
| 2018/0114550 A1 | 4/2018 | Cho | |
| 2020/0075063 A1 | 3/2020 | Lovett | |
| 2020/0082894 A1 | 3/2020 | Singh et al. | |
| 2020/0111529 A1 | 4/2020 | Shin | |
| 2020/0185011 A1 | 6/2020 | Park | |
| 2020/0343245 A1 | 10/2020 | Yamazaki et al. | |
| 2020/0402577 A1 | 12/2020 | Onuki et al. | |
| 2022/0148660 A1 | 5/2022 | Hioka | |

FOREIGN PATENT DOCUMENTS

| | | |
|---|---|---|
| CN | 101030447 A | 9/2007 |
| CN | 1101593552 A | 12/2009 |
| CN | 103474093 A | 12/2013 |
| CN | 103677966 A | 3/2014 |
| CN | 104952481 A | 9/2015 |
| CN | 105023609 A | 11/2015 |
| CN | 105677593 A | 6/2016 |
| CN | 205845518 U | 12/2016 |
| CN | 107358976 A | 11/2017 |
| CN | 107978329 A | 5/2018 |
| CN | 108109646 A | 6/2018 |
| CN | 108447511 A | 8/2018 |
| CN | 110875070 A | 3/2020 |
| CN | 110910925 A | 3/2020 |
| CN | 111009276 A | 4/2020 |
| CN | 111292776 A | 6/2020 |
| CN | 111316423 A | 6/2020 |
| CN | 111373476 A | 7/2020 |
| EP | 2444406 A1 | 4/2012 |
| EP | 3944248 A1 | 1/2022 |
| JP | H05266658 A | 10/1993 |
| JP | H0950325 A | 2/1997 |
| JP | H09265787 A | 10/1997 |
| JP | H10105533 A | 4/1998 |
| JP | 2003196991 A | 7/2003 |
| JP | 3942425 B2 | 7/2007 |
| JP | 2008004153 A | 1/2008 |
| JP | 2008270732 A | 11/2008 |
| JP | 2009295246 A | 12/2009 |
| JP | 2012161090 A | 8/2012 |
| KR | 20060131561 A | 12/2006 |
| KR | 20100129991 A | 12/2010 |
| WO | 9720625 A1 | 6/1997 |
| WO | 2019130144 A1 | 7/2019 |

OTHER PUBLICATIONS

International Search Report in the international application No. PCT/CN2021/106060, dated Oct. 20, 2021, 2 pgs.
International Search Report in the international application No. PCT/CN2021/103838, dated Sep. 28, 2021, 2 pgs.
International Search Report in the international application No. PCT/CN2021/106093, dated Oct. 11, 2021, 2 pgs.
International Search Report in the international application No. PCT/CN2021/100697, dated Aug. 27, 2021, 2 pgs.
First Office Action of the U.S. Appl. No. 17/452,339, issued on Apr. 27, 2023, 74 pages.
Notice of Allowance of the U.S. Appl. No. 17/449,573, issued on Apr. 5, 2023, 35 pages.
First Office Action of the Chinese application No. 20201879440.4, issued on May 27, 2023, 12 pages.
First Office Action of the Chinese application No. 202010879444.2, issued on May 30, 2023, 8 pages.
Notice of Allowance of the Chinese application No. 202010880909. 6, issued on Jun. 1, 2023, 5 pages.
Supplementary European Search Report in the European application No. 21859939.7, mailed on Jul. 3, 2023. 9 pages.
Notice of Allowance of the Chinese application No. 20210880935. 9, issued on Jun. 14, 2023. 5 pages.
Supplementary European Search Report in the European application No. 21859863.9, mailed on Aug. 31, 2023, 23 pages.
Non-Final Office Action of the U.S. Appl. No. 17/577,611, mailed on Jul. 14, 2023, 37 pages.

* cited by examiner

METHOD AND SYSTEM FOR ADJUSTING MEMORY, AND SEMICONDUCTOR DEVICE

CROSS-REFERENCE TO RELATED APPLICATIONS

This is a continuation of International Application No. PCT/CN2021/106060, filed on Jul. 13, 2021, and entitled "Method and System for Adjusting Memory, and Semiconductor Device", which claims priority to Chinese patent application No. 202010880935.9, filed on Aug. 27, 2020, and entitled "Method and System for Adjusting Memory, and Semiconductor Device". The disclosures of International Application No. PCT/CN2021/106060 and Chinese patent application No. 202010880935.9 are hereby incorporated by reference in their entireties.

TECHNICAL FIELD

The disclosure relates to the field of semiconductors, and more particularly, to a method and a system for adjusting a memory, and a semiconductor device.

BACKGROUND

A memory is one of three indispensable parts of a computer, and the memory is one of the key devices that can determine the performance of a system. And the memory may work as a temporary warehouse, responsible for the transfer and temporary storage of data.

A key performance indicator of the memory is the time for reading/writing data of the memory. Data writing of the memory does not refer to writing the data into a storage capacitor immediately, because the charging of a strobe transistor and a capacitor must take a period of time. That is, the data writing of the memory requires a certain writing cycle. In order to guarantee an accuracy of the data writing, a sufficient time for writing the data may be reserved.

However, an actual time at which data is written into the memory may be affected by a temperature; it may cause that the actual time at which the data is written into the memory will be longer than the sufficient time for writing the data that is reserved. Therefore, the data may be not completely written into the storage capacitor.

SUMMARY

Embodiments of the disclosure provide a method for adjusting a memory. The memory includes a transistor, a gate of the transistor is electrically connected with a Word Line (WL) of the memory, one of a source and a drain of the transistor is electrically connected with a Bit Line (BL) of the memory through a sense amplifier, and another one of the source and the drain of the transistor is electrically connected with a storage capacitor of the memory. The method includes: acquiring a mapping relationship between a temperature of the transistor, an equivalent width-length ratio of a sense amplifier transistor in the sense amplifier, and an actual time at which data is written into the memory; acquiring a current temperature of the transistor; and adjusting the equivalent width-length ratio, based on the current temperature and the mapping relationship, so that the actual time at which the data is written into the memory corresponding to the adjusted equivalent width-length ratio is within a preset writing time.

Embodiments of the disclosure further provide a system for adjusting a memory, which includes a first acquisition module, a second acquisition module, a processing module, and an adjustment module. The first acquisition module is configured to acquire a mapping relationship between a temperature of a transistor, an equivalent width-length ratio of a sense amplifier transistor in the sense amplifier, and an actual time at which data is written into the memory. The second acquisition module is configured to acquire a current temperature of the transistor. The processing module is configured to acquire an adjustment mode of the equivalent width-length ratio, based on the current temperature and the mapping relationship. The adjusting module is configured to adjust the equivalent width-length ratio, based on the adjustment mode, so that the actual time at which the data is written into the memory corresponding to the adjusted equivalent width-length ratio is within a preset writing time.

Embodiments of the disclosure further provide a semiconductor device, which includes a memory and the system for adjusting the memory mentioned above. The sense amplifier transistor in the sense amplifier in the memory includes an array of sense amplifier transistors arranged in parallel. The system for adjusting the memory is configured to adjust the equivalent width-length ratio of the sense amplifier transistor in the sense amplifier, based on the temperature of the transistor in the memory, so that the actual time at which the data is written into the memory corresponding to the adjusted equivalent width-length ratio is within the preset writing time.

BRIEF DESCRIPTION OF THE DRAWINGS

One or more embodiments are exemplarily described by figures in corresponding drawings. Unless otherwise stated, the figures in the corresponding drawings do not constitute scale limitation.

DETAILED DESCRIPTION

In order to make the objectives, technical solutions and advantages of the embodiments of the disclosure clearer, each embodiment of the disclosure will be described below in combination with the drawings in detail. However, those of ordinary skill in the art may understand that, in each embodiment of the disclosure, many technical details will be proposed to make readers to better understand the disclosure. However, the technical solutions claimed by the disclosure may further be implemented even without these technical details and various variations and modifications made based on each of the following embodiments. Division of each of the following embodiments is merely for convenient description and should not form any limitation to specific implementations of the disclosure. Each embodiment may be combined and refer to each other without conflicts.

Figure 1:
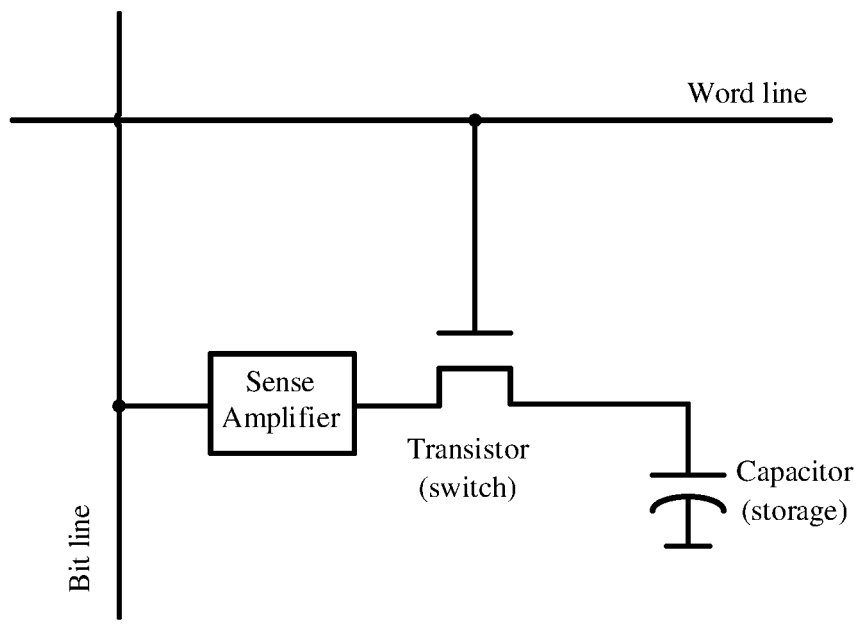
FIG. 1 is a schematic diagram of a connection structure of a memory transistor provided by an embodiment of the disclosure.

Referring to FIG. 1, FIG. 1 is a structural schematic diagram of an individual storage unit in a memory according to an embodiment of the disclosure. There may be a plurality of storage capacitors in the memory, and the selection of a target storage capacitor may be implemented through a Bit Line (BL) structure and a Word Line (WL) structure. The WL structure may be connected with a gate of a transistor, the BL structure may be connected with one of a source and a drain of the transistor through a Sense Amplifier (SA), and another one of the source and the drain of the transistor may be connected with the storage capacitor. In the connection structure formed in this way, the transistor may function as a switch. When a gate voltage input into the transistor in the WL structure is greater than a threshold voltage of the transistor, the transistor may be turned on, and the electrical connection may be formed between the storage capacitor and the BL structure. When a voltage of the storage capacitor is less than a voltage of the BL structure, the storage capacitor may be discharged, namely a process for reading the data. And when the voltage of the storage capacitor is greater than the voltage of the BL structure, the storage capacitor may be charged, namely a process for writing the data. From the above content, it may be seen that the process for reading/writing the data of the memory can be achieved by charging/discharging the storage capacitor in the memory. However, the charging of the memory requires a certain period of time to guarantee the execution of the charging process. That is, a certain period of time needs to be reserved for the process for writing the data into the memory, to guarantee the complete writing of the data.

Figure 2:
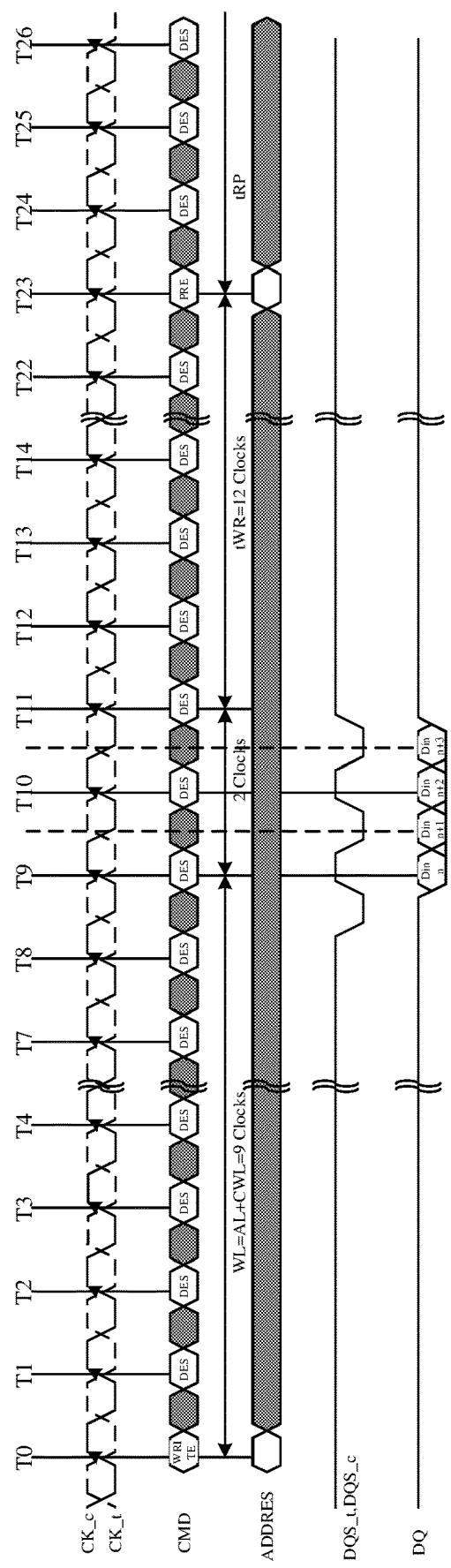
FIG. 2 is a structural schematic diagram of a writing time sequence of a memory provided by an embodiment of the disclosure.

Referring to FIG. 2, FIG. 2 is a time sequence diagram for writing the data into the memory according to an embodiment of the disclosure. It should be noted that FIG. 2 is merely a schematic diagram of a writing time sequence of a section of the storage area, and does not constitute a limitation to the embodiments of the disclosure. The objective is to make those of ordinary skill in the art understand the purpose of the solution. As shown in FIG. 2, the command to execute the process for writing the data may be received at a moment T0. Since the memory contains many storage capacitors, the target storage capacitor needs to be found before the process for writing the data is executed, T1~T9 are the addressing time. After finding the target storage capacitor, the writing operation will be executed, and T9~T11 are the execution of the process for writing the data. T11~T23 are free time to guarantee the complete execution of the process for writing the data, namely, Write Recovery time (tWR). And after T23 and a pre-charging process, the BL structure needs to be pre-charged after the data being written, so that the memory may execute a next operation command normally. Here, each of the T9~T23 are the time in which the data is written into the memory.

Before the memory works, a preset writing time may be set for the memory, and used for the process for writing the data into the memory. In the related art, during the actual working process of the memory, due to the influence of factors such as a temperature of the transistor and an equivalent width-length ratio of a sense amplifier transistor in the sense amplifier, an actual time at which the data is written into the memory may be affected. When the actual time at which the data is written into the memory is less than or equal to the preset writing time, the process for writing the data into the memory may be executed normally, and there is free time at this time. And when the actual time at which the data is written into the memory is greater than the preset writing time, the process for writing the data into the memory may not be executed normally. In response to the preset writing time being set too large, the reading-writing efficiency of the memory may be lower.

It should be noted that, in the embodiments of the disclosure, the temperature of the transistor may refer to the temperature of the transistor itself.

The execution subject of the embodiments of the disclosure may be a system for adjusting a memory, which will not be limited here.

Figure 3:
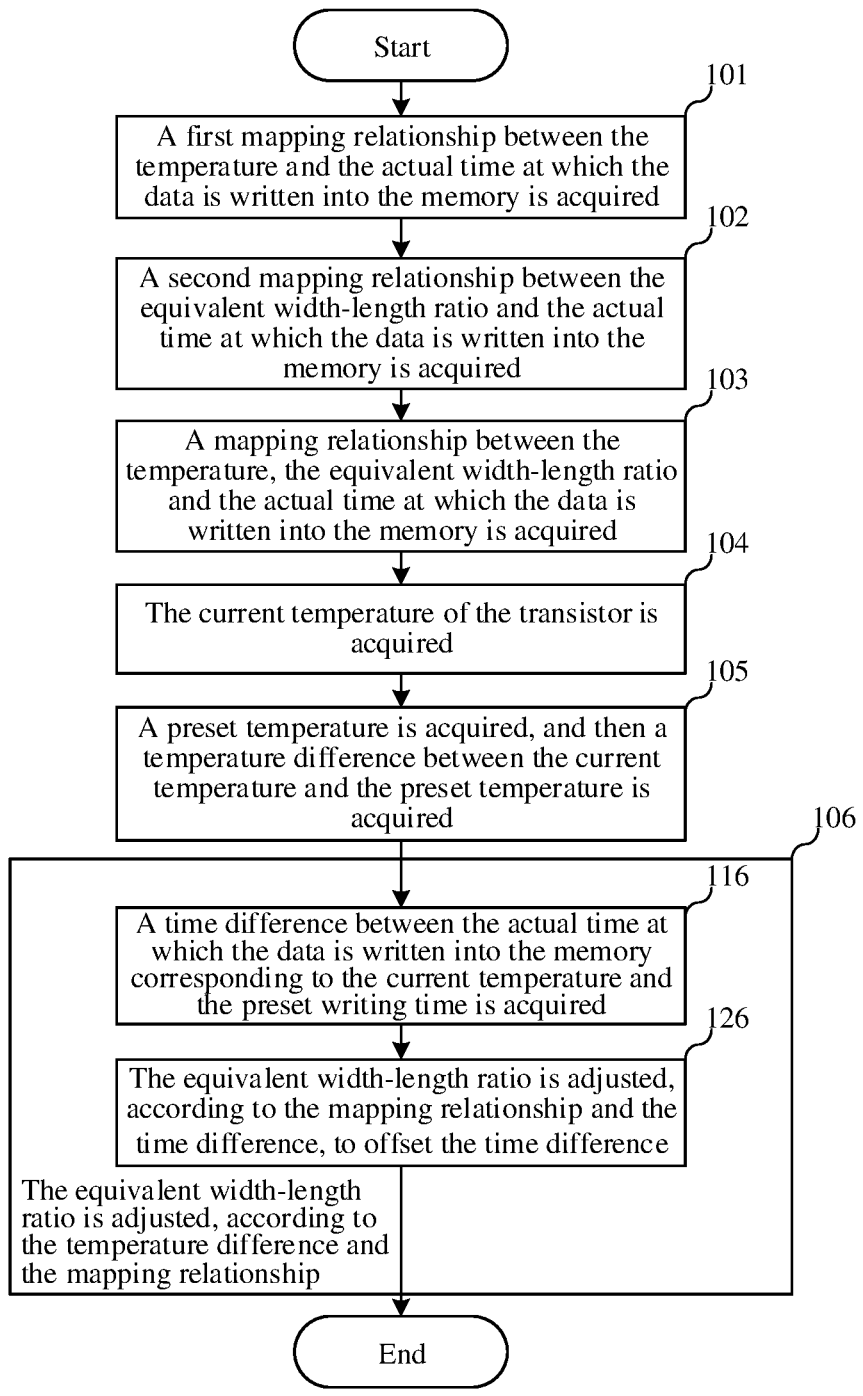
FIG. 3 is a first schematic flowchart of a method for adjusting a memory provided by an embodiment of the disclosure.

FIG. 3 is a schematic flowchart of a method for adjusting a memory according to an embodiment of the disclosure. The method for adjusting the memory of the embodiment of the disclosure will be described in detail below with reference to FIG. 3.

It should be noted that, according to the embodiment of the disclosure, the equivalent width-length ratio of the sense amplifier transistor in the sense amplifier is mainly adjusted to compensate for the influence of the temperature on the actual time at which the data is written into the memory. It does not mean that other conditions do not affect the actual time at which the data is written into the memory. In the embodiment of the disclosure, in addition to the temperature of the transistor and the equivalent width-length ratio of the sense amplifier transistor in the sense amplifier, other conditions that affect the actual time at which the data is written into the memory may be kept unchanged by default.

Referring to FIG. 3, the method for adjusting the memory includes the following steps.

At step S101, a first mapping relationship between the temperature and the actual time at which the data is written into the memory is acquired.

It can be noted that, since a decrease of the temperature of the transistor may cause an increase of a contact resistance R of the transistor, and the decrease of the temperature of the transistor may also cause an increase of a threshold voltage Vth of the transistor. Correspondingly, an increase of the temperature of the transistor may cause a decrease of the contact resistance R of the transistor, and the increase of the temperature of the transistor may also cause a decrease of the threshold voltage Vth of the transistor.

From the aforementioned description of the structure, it may be seen that the BL structure may be electrically connected with the storage capacitor when the transistor is turned on. The transistor being turned on may mean that the gate voltage Vgs of the transistor is greater than Vth. And a difference Vgs−Vth between Vgs and Vth is positively correlated with a source-drain current Ids of the transistor. That is, when the difference Vgs−Vth between Vgs and Vth is larger, Ids will be larger. Ids refers to a charging current of the storage capacitor. When Ids is larger, the actual time at which the data is written into the memory will be shorter. That is, when the temperature of the transistor is decreased, the threshold voltage Vth will be increased, the source-drain current Ids of the transistor will be decreased, and the actual time at which the data is written into the memory will become longer. Additionally, when the temperature of the transistor is increased, the threshold voltage Vth will be decreased, the source-drain current Ids of the transistor will be increased, and the actual time at which the data is written into the memory will become shorter.

According to the embodiment of the disclosure, in the system for adjusting the memory, a method for acquiring the first mapping relationship may include the following steps. Firstly, the equivalent width-length ratio of the sense amplifier transistor in the sense amplifier may be kept unchanged, and the temperature of the transistor may be changed, to acquire the first mapping relationship between the temperature of the transistor and the actual time at which the data is written into the memory. The first mapping relationship may be a two-dimensional mapping relationship, where an independent variable may be the temperature of the transistor, and a dependent variable may be the actual time at which the data is written into the memory. Then, in the system for adjusting the memory, the equivalent width-length ratio of the sense amplifier transistor in the sense amplifier may be changed, and the equivalent width-length ratio of the sense amplifier transistor in the sense amplifier may be kept unchanged after the equivalent width-length ratio being changed; and then the temperature of the transistor may be changed, to acquire the first mapping relationship between the temperature of the transistor and the actual time at which the data is written into the memory. Therefore, the first mapping relationship of the actual time at which the data is written into the memory changed with the equivalent width-length ratio of the sense amplifier transistor in the sense amplifier at the different temperatures may be acquired.

At step S102, a second mapping relationship between the equivalent width-length ratio and the actual time at which the data is written into the memory is acquired.

It should be noted that, when the transistor is in the linear amplification region and the gate voltage Vgs of the transistor is kept unchanged, the source-drain current Ids of the transistor is positively correlated with a source-drain voltage Vds of the transistor. That is, when Vds is larger, the Ids will be larger. From the aforementioned description, it may be seen that the increase of the source-drain current Ids of the transistor may cause the actual time at which the data is written into the memory to be shorter. Since the equivalent width-to-length ratio of the sense amplifier transistor in the sense amplifier determines the amplification effect of the sense amplifier, when the amplification effect of the sense amplifier is better, the source-drain voltage Vds of the transistor will be larger, and the source-drain current Ids of the transistor will also be larger.

At this time, when the equivalent width-length ratio of the sense amplifier transistor is larger, the source-drain voltage Vds of the amplifier transistor input to the transistor will be larger, to increase the source-drain current Ids of the transistor which will cause the time for writing the data into the storage capacitor being shorter. Additionally, when the equivalent width-length ratio of the sense amplifier transistor is smaller, the source-drain voltage Vds of the amplifier transistor input to the transistor will be smaller, to decrease the source-drain current Ids of the transistor which will cause the time for writing the data into the storage capacitor being longer.

According to the embodiment of the disclosure, a method for acquiring the second mapping relationship may include the following steps. Firstly, the temperature of the transistor may be kept unchanged, and the equivalent width-length ratio of the sense amplifier transistor in the sense amplifier may be changed, to acquire the second mapping relationship between the equivalent width-length ratio of the sense amplifier transistor in the sense amplifier and the actual time at which the data is written into the memory. The second mapping relationship may be a two-dimensional mapping relationship, where an independent variable may be the equivalent width-length ratio of the sense amplifier transistor in the sense amplifier, and a dependent variable may be the actual time at which the data is written into the memory. Then, in the system for adjusting the memory, the temperature of the transistor may be changed, the temperature of the transistor may be kept unchanged after the temperature of the transistor being changed, and the equivalent width-length ratio of the sense amplifier transistor in the sense amplifier may be changed, to acquire the second mapping relationship between the equivalent width-length ratio of the sense amplifier transistor in the sense amplifier and the actual time at which the data is written into the memory. Therefore, the second mapping relationship of the actual time at which the data is written into the memory changed with the equivalent width-length ratio of the sense amplifier transistor in the sense amplifier at the different temperatures may be acquired.

At step S103, a mapping relationship between the temperature, the equivalent width-length ratio and the actual time at which the data is written into the memory is acquired.

According to the embodiment of the disclosure, in the system for adjusting the memory, based on the first mapping relationship and the second mapping relationship, the mapping relationship between the temperature of the transistor, the equivalent width-length ratio of the sense amplifier transistor in the sense amplifier and the actual time at which the data is written into the memory may be acquired. The mapping relationship is a three-dimensional mapping relationship.

It should be noted that the steps of S101, S102, and S103 in the embodiment may provide a specific method for acquiring the mapping relationship between the temperature of the transistor, the equivalent width-length ratio of the sense amplifier transistor in the sense amplifier and the actual time at which the data is written into the memory. The data of the temperature of the transistor, the equivalent width-length ratio of the sense amplifier transistor in the sense amplifier, and the actual time at which the data is written into the memory may correspond to each other, as to guarantee the accuracy of the adjustment of the time for writing the actual data into the memory. In other embodiments, the relationship between the three may be directly adjusted to acquire the aforementioned mapping relationship.

At step S104, the current temperature of the transistor is acquired.

According to the embodiment of the disclosure, in the system for adjusting the memory, the current temperature of the transistor may be acquired by a temperature sensor arranged in the memory. In the system for adjusting the memory, the current temperature of the transistor may be directly acquired by the temperature sensor, and the acquired temperature will be accurate and the error will be small. In the system for adjusting the memory, the current temperature of the transistor may also be acquired by acquiring the ambient temperature at which the memory works.

At step S105, a preset temperature is acquired, and then a temperature difference between the current temperature and the preset temperature is acquired.

At step S106, the equivalent width-length ratio is adjusted, according to the temperature difference and the mapping relationship.

In some embodiments of the disclosure, in the system for adjusting the memory, the method for adjusting the equivalent width-length ratio according to the temperature difference and the mapping relationship may include the following steps, to implement a step of S116.

At step S116, a time difference between the actual time at which the data is written into the memory corresponding to the current temperature and the preset writing time is acquired.

It should be noted that, before the memory is powered on, a preset temperature of the transistor, a preset equivalent width-length ratio of the sense amplifier transistor in the sense amplifier, and the preset writing time of the transistor may be set. The preset temperature, the preset equivalent width-length ratio and the preset writing time may also meet the aforementioned mapping relationship.

According to the embodiment of the disclosure, in the system for adjusting the memory, according to the temperature difference between the current temperature and the preset temperature, a time difference between the actual time at which the data is written into the memory and the preset writing time under the current equivalent width-length ratio may be acquired. That is, the change of the actual time at which the data is written into the memory caused by the temperature change may be acquired.

At step S126, the equivalent width-length ratio is adjusted, according to the mapping relationship and the time difference, to offset the time difference.

It should be noted that, due to the temperature change of the transistor, the actual time at which the data is written into the memory may be changed, but this change is not beneficial to the use of the memory. Therefore, it is necessary to adjust the equivalent width-length ratio of the sense amplifier transistor in the sense amplifier, to stabilize the actual time at which the data is written into the memory. That is, the time difference may be offset by adjusting the equivalent width-length, thereby the actual time at which the data is written into the memory can be stabilized.

According to the embodiment of the disclosure, the sense amplifier transistor may include an array of sense amplifier transistors arranged in parallel; and the method for adjusting the equivalent width-length ratio may include: adjusting the equivalent width-length ratio of the sense amplifier transistor in the sense amplifier by adjusting a number of the sense amplifier transistors in the array connected to the sense amplifier. Here, the more sense amplifiers connected in parallel, will cause an increase of the equivalent width-to-length ratio of the sense amplifier transistors. Additionally, the less sense amplifiers connected in parallel, will cause a decrease of the equivalent width-to-length ratio of the sense amplifier transistors.

It should be noted that, since the temperature may affect the actual time at which the data is written into the memory, the mapping relationship between the temperature of the transistor, the equivalent width-length ratio of the sense amplifier transistor in the sense amplifier and the actual time at which the data is written into the memory may be acquired firstly. The actual time at which the data is written into the memory may be acquired according to the current temperature of the transistor. Then, the actual time at which the data is written into the memory of the transistor at the current temperature may be adjusted by adjusting the equivalent width-length ratio of the sense amplifier transistor in the sense amplifier. Therefore, the adjusted time for writing the data will be within the preset time, as to guarantee that the data will be completely written into the storage capacitor.

It should be noted that, the division of the various steps above is merely for clarity of description. During the implementation, it may be combined into one step, or some steps may be split into a plurality of steps, as long as the steps include a same logical relationship, all fall within a scope of protection of the present application. In the process, insignificant modifications may be added or insignificant designs may be introduced, but core designs without changing the process thereof are all within the scope of protection of the present application.

Some embodiments of the disclosure may relate to a method for adjusting the memory. The difference from the aforementioned embodiments is that in the embodiments, before adjusting the equivalent width-length ratio according to the temperature difference, it may be determined whether the temperature difference exceeds a preset range. The actual time at which the data is written into the memory may be adjusted only when the temperature difference exceeds the preset range. Therefore, unnecessary adjustment operations can be reduced, and the adjustment cost can be saved.

Figure 4:
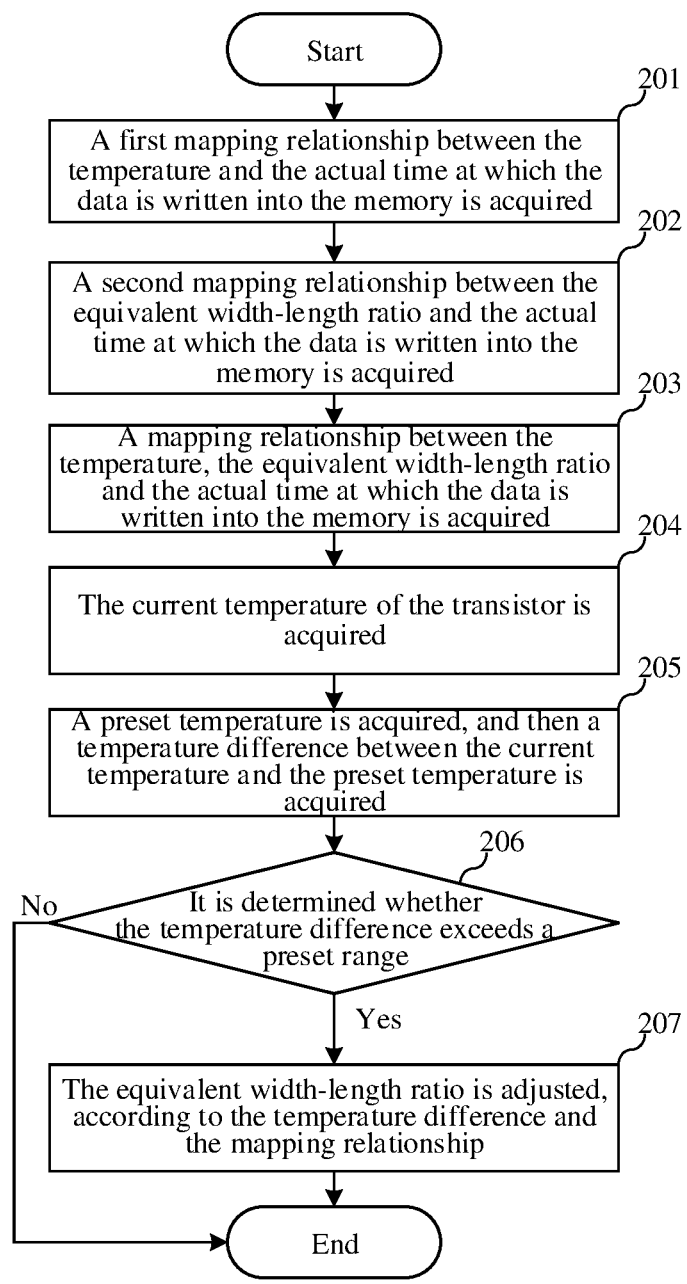
FIG. 4 is a second schematic flowchart of a method for adjusting a memory provided by an embodiment of the disclosure.

FIG. 4 is a schematic flowchart of the method for adjusting the memory provided by some embodiments of the disclosure. The method for adjusting the memory of the embodiments of the disclosure will be described in detail below with reference to FIG. 4.

Referring to FIG. 4, the method for adjusting the memory may include the following steps.

At step S201, a first mapping relationship between the temperature and the actual time at which the data is written into the memory is acquired.

At step S202, a second mapping relationship between the equivalent width-length ratio and the actual time at which the data is written into the memory is acquired.

At step S203, a mapping relationship between the temperature, the equivalent width-length ratio, and the actual time at which the data is written into the memory is acquired.

At step S204, the current temperature of the transistor is acquired.

At step S205, a preset temperature is acquired, and then a temperature difference between the current temperature and the preset temperature is acquired.

Here, the steps of S201 to S205 may be the same as the steps of S101 to S105 in the first embodiment, and it will not be repeatedly described herein.

At step S206, it is determined whether the temperature difference exceeds a preset range.

According to the embodiments of the disclosure, in the system for adjusting the memory, it may be further determined whether the temperature difference between the current temperature of the transistor and the preset temperature exceeds the preset range before adjusting the equivalent width-length ratio of the sense amplifier transistor in the sense amplifier. In response to the temperature difference exceeding the preset range, in the system for adjusting the memory, the equivalent width-length ratio of the sense amplifier transistor in the sense amplifier may be adjusted according to the temperature difference and the mapping relationship. That is, a step of S207 will be performed.

At step S207, the equivalent width-length ratio is adjusted, according to the temperature difference and the mapping relationship.

According to the embodiments of the disclosure, in response that the current temperature is greater than the preset temperature and exceeds the preset range, and the transistor is an N-type transistor, the equivalent width-length ratio may be adjusted to be increased in the method. And in response that the current temperature is less than the preset temperature and exceeds the preset range, and the transistor is the N-type transistor, the equivalent width-length ratio may be adjusted to be decreased in the method. In response that the current temperature is greater than the preset temperature and exceeds the preset range, and the transistor is a P-type transistor, the equivalent width-length ratio may be adjusted to be decreased in the method. And in response that the current temperature is less than the preset temperature and exceeds the preset range, and the transistor is the P-type transistor, the equivalent width-length ratio may be adjusted to be increased in the method.

Further, the embodiments may further divide the preset range, where the preset range may include a first preset range and a second preset range, and the second preset range may be larger than the first preset range.

In the system for adjusting the memory, in response to the temperature difference exceeding the first preset range and not exceeding the second preset range, the equivalent width-length ratio may be increased or decreased by a first preset value. And in the system for adjusting the memory, in response to the temperature difference exceeding the second preset range, the equivalent width-length ratio may be increased or decreased by a second preset value. The second preset value may be greater than the first preset value, and the first preset value and the second preset value may be fixed values.

It can be understood that, by performing segmental adjustment on the preset division, on the basis of saving the adjustment cost, the accuracy of adjusting the actual time at which the data is written into the memory can be improved.

It should be noted that, in some embodiments of the disclosure, the preset range may be divided into at least three sub-preset ranges. By dividing into more sub-preset ranges, the accuracy of adjusting the actual time at which the data is written into the memory can be further improved.

It can be understood that, since the temperature may affect the actual time at which the data is written into the memory, the mapping relationship between the temperature of the transistor, the equivalent width-length ratio of the sense amplifier transistor in the sense amplifier and the actual time at which the data is written into the memory may be acquired firstly. The actual time at which the data is written into the memory may be acquired according to the current temperature of the transistor. Then, the actual time at which the data is written into the memory of the transistor at the current temperature may be adjusted by adjusting the equivalent width-length ratio of the sense amplifier transistor in the sense amplifier. Therefore, the adjusted time for writing the data will be within the preset time, as to guarantee that the data will be completely written into the storage capacitor.

It should be noted that, the division of the various steps above is merely for clarity of description. During the implementation, it may be combined into one step, or some steps may be split into a plurality of steps, as long as the steps include a same logical relationship, all fall within a scope of protection of the present application. In the process, insignificant modifications may be added or insignificant designs may be introduced, but core designs without changing the process thereof are all within the scope of protection of the present application.

Figure 5:
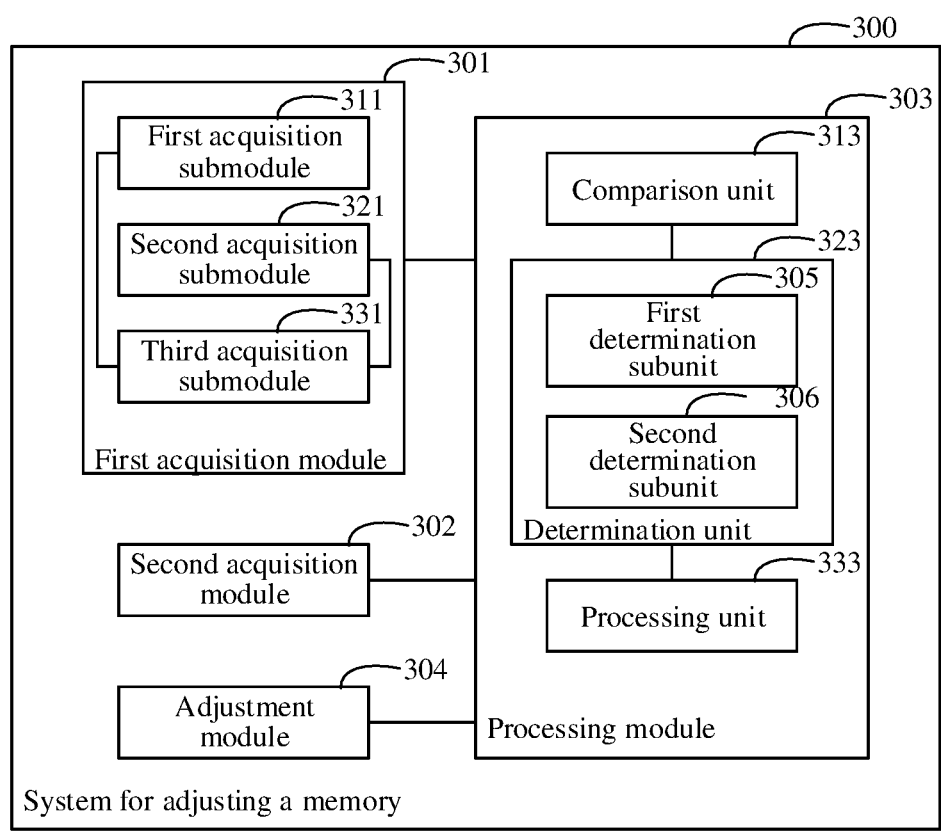
FIG. 5 is a structural schematic diagram of a system for adjusting a memory provided by an embodiment of the disclosure.

According to an embodiment of the disclosure, it is provided a system 300 for adjusting a memory. Referring to FIG. 5, the system for adjusting the memory provided in the embodiment will be described in detail below in combination with FIG. 5. The parts that are the same as or corresponding to the aforementioned embodiments will not be repeatedly described in detail below.

The system 300 for adjusting the memory includes a first acquisition module 301, a second acquisition module 302, a processing module 303, and an adjustment module 304.

The first acquisition module 301 is configured to acquire a mapping relationship between a temperature of the transistor, an equivalent width-length ratio of a sense amplifier transistor in a sense amplifier and an actual time at which data is written into the memory. Here, the mapping relationship may be a three-dimensional mapping relationship.

The second acquisition module 302 is configured to acquire a current temperature of the transistor.

According to an embodiment of the disclosure, in the system for adjusting the memory, the current temperature of the transistor may be acquired by a temperature sensor arranged in the memory. In the system for adjusting the memory, the current temperature of the transistor may be directly acquired by the temperature sensor, and the acquired temperature will be accurate and the error will be small. In some embodiments of the disclosure, the current temperature of the transistor may also be acquired by acquiring the ambient temperature at which the memory works.

The processing module 303 is configured to acquire an adjustment mode of the equivalent width-length ratio, based on the current temperature and the mapping relationship.

According to an embodiment of the disclosure, the processing module may include a comparison unit 313 and a processing unit 333.

The comparison unit 313 may be configured to acquire a preset temperature corresponding to the preset writing time, and acquire a temperature difference between the current temperature and the preset temperature.

The processing unit 333 may be configured to acquire the adjustment mode of the equivalent width-length ratio, according to the temperature difference and the mapping relationship.

According to an embodiment of the disclosure, before the memory is powered on, the preset temperature of the transistor, the preset equivalent width-length ratio of the sense amplifier transistor in the sense amplifier and the preset writing time of the transistor may be set. Here, the preset temperature, the preset equivalent width-length ratio and the preset writing time may also meet the aforementioned mapping relationship. The processing unit 333 may acquire a time difference between the actual time at which the data is written into the memory and the preset writing time under the current equivalent width-length ratio of the sense amplifier transistor in the sense amplifier, according to the temperature difference between the current temperature and the preset temperature. That is, the change of the actual time at which the data is written into the memory caused by the temperature change may be acquired. Due to the temperature change of the transistor, the actual time at which the data is written into the memory may be changed, but this change is not beneficial to the use of the memory. Therefore, the equivalent width-length ratio of the sense amplifier transistor in the sense amplifier needs to be adjusted by the processing unit 333 to stabilize the actual time at which the data is written into the memory. That is, the equivalent width-length ratio may be adjusted to offset the time difference, according to the mapping relationship and the time difference. Therefore, the actual time at which the data is written into the memory can be stabilized.

The adjustment module 304 is configured to adjust the equivalent width-length ratio, based on the adjustment mode, so that the actual time at which the data is written into the memory corresponding to the adjusted equivalent width-length ratio may be within a preset writing time.

In an example, the first acquisition module 301 may include a first acquisition submodule 311, a second acquisition submodule 321, and a third acquisition submodule 331.

According to an embodiment of the disclosure, the first acquisition submodule 311 may keep the equivalent width-length ratio of the sense amplifier transistor in the sense amplifier unchanged, to acquire the first mapping relationship between the temperature of the transistor and the actual time at which the data is written into the memory. Here, an independent variable may be the temperature of the transistor, and a dependent variable may be the actual time at which the data is written into the memory. The first mapping relationship may be a two-dimensional mapping relationship.

The second acquisition submodule 321 may be configured to acquire a second mapping relationship between the equivalent width-length ratio of the sense amplifier transistor in the sense amplifier and the actual time at which the data is written into the memory.

According to an embodiment of the disclosure, the second acquisition submodule 321 may keep the temperature of the transistor unchanged, to acquire the second mapping relationship between the equivalent width-length ratio of the sense amplifier transistor in the sense amplifier and the actual time at which the data is written into the memory. Here, an independent variable may be the equivalent width-length ratio of the sense amplifier transistor in the sense amplifier, and a dependent variable may be the actual time at which the data is written into the memory. The second mapping relationship may be a two-dimensional mapping relationship.

The third acquisition submodule 331 may be configured to acquire the mapping relationship between the temperature of the transistor, the equivalent width-length ratio of the sense amplifier transistor in the sense amplifier and the actual time at which the data is written into the memory, based on the first mapping relationship and the second mapping relationship.

According to some embodiments of the disclosure, the processing module 303 may further include a determination unit 323. The determination unit 323 may be configured to determine whether the temperature difference exceeds a preset range. And in response to the temperature difference exceeds the preset range, the processing unit 333 may be configured to acquire the adjustment mode of the equivalent width-length ratio, according to the temperature difference and the mapping relationship.

According to an embodiments of the disclosure, the determination unit 323 may include a first determination subunit 305 and a second determination subunit 306. By performing segmental adjustment on the preset division by the determination unit 323, on the basis of saving the adjustment cost, the accuracy of adjusting the actual time at which the data is written into the memory can be improved.

The first determination subunit 305 may be configured to determine whether the temperature difference exceeds a first preset range.

The second determination subunit 306 may be configured to determine whether the temperature difference exceeds a second preset range, and the second preset range may be greater than the first preset range.

It should be noted that in other embodiments, the determination unit may include at least three determination subunits. By dividing the preset range into at least three preset sub-ranges and by dividing into more preset sub-ranges, the accuracy of adjusting the actual time at which the data is written into the memory can be further improved.

It can be understood that, since the temperature may affect the actual time at which the data is written into the memory, the mapping relationship between the temperature of the transistor, the equivalent width-length ratio of the sense amplifier transistor in the sense amplifier and the actual time at which the data is written into the memory may be acquired by the first acquisition module. The actual time at which the data is written into the memory may be acquired according to the current temperature of the transistor by the second acquisition module. The adjustment mode of the equivalent width-length ratio of the sense amplifier transistor in the sense amplifier may be acquired by the processing module. And the equivalent width-length ratio of the sense amplifier transistor in the sense amplifier may be adjusted by the adjustment module, to adjust the actual time at which the data is written into the memory of the transistor at the current temperature. Therefore, the adjusted time for writing the data will be within the preset time, as to guarantee that the data will be completely written into the storage capacitor.

It should be noted that, operations and functions of the aforementioned modules and units involved in the embodiment of the disclosure, can be implemented by corresponding circuits.

Additionally, it is worth mentioning that the modules involved in this embodiment are all logical modules. In practical applications, a logical unit may be a physical unit, or a part of a physical unit, or may be implemented by a combination of a plurality of physical units. In addition, in order to highlight the innovative part of the present application, this embodiment does not introduce units that are not closely related to solving the technical problem proposed by the present application, but this does not indicate that there are no other units in this embodiment.

It should be noted that, since the first embodiment and the second embodiment correspond to this embodiment mutually, this embodiment may be implemented in cooperation with the first embodiment and the second embodiment mutually. The related technical details mentioned in the first embodiment and the second embodiment are still valid in this embodiment. And the technical effects that may be achieved in the first embodiment and the second embodiment may also be achieved in this embodiment. In order to reduce repetition, it will not be repeatedly described here. Correspondingly, the related technical details mentioned in this embodiment may also be applied to the first embodiment and the second embodiment.

According to an embodiment of the disclosure, it is provided a semiconductor device.

The semiconductor device includes a memory and the system for adjusting the memory provided in the aforementioned embodiments. In the system for adjusting the memory, the sense amplifier transistor in the sense amplifier in the memory comprises an array of sense amplifier transistors arranged in parallel. The system for adjusting the memory is configured to adjust the equivalent width-length ratio of the sense amplifier transistor in the sense amplifier, based on the temperature of the transistor in the memory, so that the actual time at which the data is written into the memory corresponding to the adjusted equivalent width-length ratio is within the preset writing time. And the step of adjusting the equivalent width-length ratio includes: adjusting the equivalent width-length ratio by adjusting a number of the sense amplifier transistors in the array.

Since the aforementioned embodiments correspond to this embodiment mutually, this embodiment may be implemented in cooperation with the aforementioned embodiments mutually. The related technical details mentioned in the aforementioned embodiments are still valid in this embodiment. And the technical effects that may be achieved in the aforementioned embodiments may also be achieved in this embodiment. In order to reduce repetition, it will not be repeatedly described here. Correspondingly, the related technical details mentioned in this embodiment may also be applied to the aforementioned embodiments.

Those of ordinary skill in the art may understand that the aforementioned embodiments are specific embodiments for implementing the present application. And in practical applications, various variations may be made in forms and details without departing from the spirit and scope of the present application.

In the embodiments of the disclosure, there is provided a method, a system for adjusting the memory, and a semiconductor device. The method for adjusting the memory includes the following operations: acquiring the mapping relationship between the temperature of the transistor, the equivalent width-length ratio of the sense amplifier transistor in the sense amplifier and the actual time at which the data is written into the memory; acquiring the current temperature of the transistor; and adjusting the equivalent width-length ratio, based on the current temperature and the mapping relationship, so that the actual time at which the data is written into the memory corresponding to the adjusted equivalent width-length ratio is within the preset writing time. Since the temperature may affect the actual time at which the data is written into the memory, in the disclosure, the mapping relationship between the temperature of the transistor, the equivalent width-length ratio and the actual time at which the data is written into the memory may be acquired firstly. And then, the actual time at which the data is written into the memory may be acquired according to the current temperature of the transistor, and the actual time at which the data is written into the memory of the transistor at the current temperature may be adjusted by adjusting the equivalent width-length ratio of the sense amplifier transistor in the sense amplifier. Therefore, the adjusted time for writing the data will be within the preset time, as to guarantee that the data may be completely written into the storage capacitor.

The invention claimed is:

1. A method for adjusting a memory, wherein the memory comprises a transistor, a gate of the transistor is electrically connected with a Word Line (WL) of the memory, one of a source and a drain of the transistor is electrically connected with a Bit Line (BL) of the memory through a sense amplifier, and another one of the source and the drain of the transistor is electrically connected with a storage capacitor of the memory, the method comprising:
  acquiring a mapping relationship between a temperature of the transistor, an equivalent width-length ratio of a sense amplifier transistor in the sense amplifier, and an actual time at which data is written into the memory;
  acquiring a current temperature of the transistor; and
  adjusting the equivalent width-length ratio, based on the current temperature and the mapping relationship, so that the actual time at which the data is written into the memory corresponding to the adjusted equivalent width-length ratio is within a preset writing time.

2. The method for adjusting the memory of claim 1, wherein adjusting the equivalent width-length ratio, based on the current temperature and the mapping relationship comprises:
  acquiring a preset temperature corresponding to the preset writing time;
  acquiring a temperature difference between the current temperature and the preset temperature; and
  adjusting the equivalent width-length ratio, according to the temperature difference and the mapping relationship.

3. The method for adjusting the memory of claim 2, wherein before adjusting the equivalent width-length ratio, according to the temperature difference and the mapping relationship, the method further comprises:
  determining whether the temperature difference exceeds a preset range; and
  in response to the temperature difference exceeding the preset range, adjusting the equivalent width-length ratio according to the temperature difference and the mapping relationship.

4. The method for adjusting the memory of claim 2, wherein adjusting the equivalent width-length ratio, according to the temperature difference and the mapping relationship comprises:
  acquiring, according to the mapping relationship, a time difference between the actual time at which the data is written into the memory corresponding to the current temperature and the preset writing time; and
  adjusting, according to the mapping relationship and the time difference, the equivalent width-length ratio to offset the time difference.

5. The method for adjusting the memory of claim 3, wherein the preset range comprises a first preset range and a second preset range, and the second preset range is greater than the first preset range;
  in response to the temperature difference exceeding the first preset range and not exceeding the second preset range, increasing or decreasing the equivalent width-length ratio, by a first preset value; and
  in response to the temperature difference exceeding the second preset range, increasing or decreasing the equivalent width-length ratio by a second preset value, wherein the second preset value is greater than the first preset value.

6. The method for adjusting the memory of claim 1, wherein acquiring the mapping relationship between the temperature of the transistor, the equivalent width-length ratio of the sense amplifier transistor in the sense amplifier, and the actual time at which the data is written into the memory comprises:
  acquiring a first mapping relationship between the temperature of the transistor and the actual time at which the data is written into the memory;
  acquiring a second mapping relationship between the equivalent width-length ratio of the sense amplifier transistor in the sense amplifier and the actual time at which the data is written into the memory; and
  acquiring, based on the first mapping relationship and the second mapping relationship, the mapping relationship between the temperature of the transistor, the equivalent width-length ratio of the sense amplifier transistor in the sense amplifier, and the actual time at which the data is written into the memory.

7. The method for adjusting the memory of claim 1, wherein the sense amplifier transistor comprises an array of sense amplifier transistors arranged in parallel,
  and adjusting the equivalent width-length ratio comprising: adjusting the equivalent width-length ratio of the sense amplifier transistor in the sense amplifier by adjusting a number of the sense amplifier transistors in the array connected to the sense amplifier.

8. A system for adjusting a memory, wherein the system is applied to the memory, the system comprising:
  a first acquisition circuit, configured to acquire a mapping relationship between a temperature of a transistor, an equivalent width-length ratio of a sense amplifier transistor in a sense amplifier, and an actual time at which data is written into the memory;

a second acquisition circuit, configured to acquire a current temperature of the transistor;

a processing circuit, configured to acquire an adjustment mode of the equivalent width-length ratio, based on the current temperature and the mapping relationship; and an adjusting circuit, configured to adjust the equivalent width-length ratio, based on the adjustment mode, so that the actual time at which the data is written into the memory corresponding to the adjusted equivalent width-length ratio is within a preset writing time.

9. The system for adjusting the memory of claim 8, wherein the second acquisition circuit comprises a temperature sensor arranged in the memory.

10. The system for adjusting the memory of claim 8, wherein the processing circuit comprises:

a comparison circuit, configured to acquire a preset temperature corresponding to the preset writing time, and acquire a temperature difference between the current temperature and the preset temperature; and a processing circuit, configured to acquire an adjustment mode of the equivalent width-length ratio, according to the temperature difference and the mapping relationship.

11. The system for adjusting the memory of claim 10, wherein the processing circuit further comprises: a determination circuit, configured to determine whether the temperature difference exceeds a preset range; and in response to the temperature difference exceeding the preset range, the processing circuit is configured to acquire the adjustment mode of the equivalent width-length ratio, according to the temperature difference and the mapping relationship.

12. The system for adjusting the memory of claim 11, wherein the determination circuit comprises a first determination sub-circuit and a second determination sub-circuit;

wherein the first determination sub-circuit is configured to determine whether the temperature difference exceeds a first preset range;

the second determination sub-circuit is configured to determine whether the temperature difference exceeds a second preset range; and wherein the second preset range is greater than the first preset range.

13. The system for adjusting of the memory of claim 8, wherein the first acquisition circuit comprises:

a first acquisition sub-circuit, configured to acquire a first mapping relationship between the temperature of the transistor and the actual time at which the data is written into the memory;

a second acquisition sub-circuit, configured to acquire a second mapping relationship between the equivalent width-length ratio of the sense amplifier transistor in the sense amplifier and the actual time at which the data is written into the memory; and a third acquisition sub-circuit, configured to, based on the first mapping relationship and the second mapping relationship, acquire the mapping relationship between the temperature of the transistor, the equivalent width-length ratio of the sense amplifier transistor in the sense amplifier, and the actual time at which the data is written into the memory.

14. A semiconductor device, comprising a memory, and a system for adjusting the memory, wherein the system for adjusting the memory is configured to:

acquire a mapping relationship between a temperature of a transistor, an equivalent width-length ratio of a sense amplifier transistor in a sense amplifier, and an actual time at which data is written into the memory;

acquire a current temperature of the transistor; and adjust the equivalent width-length ratio, based on the current temperature and the mapping relationship, so that the actual time at which the data is written into the memory corresponding to the adjusted equivalent width-length ratio is within a preset writing time.

15. The semiconductor device of claim 14, wherein in adjusting the equivalent width-length ratio, based on the current temperature and the mapping relationship, the system for adjusting the memory is further configured to:

acquire a preset temperature corresponding to the preset writing time;

acquire a temperature difference between the current temperature and the preset temperature; and adjust the equivalent width-length ratio, according to the temperature difference and the mapping relationship.

16. The semiconductor device of claim 15, before adjusting the equivalent width-length ratio, according to the temperature difference and the mapping relationship, the system for adjusting the memory is further configured to:

determine whether the temperature difference exceeds a preset range; and in response to the temperature difference exceeding the preset range, adjust the equivalent width-length ratio according to the temperature difference and the mapping relationship.

17. The semiconductor device of claim 15, wherein in adjusting the equivalent width-length ratio, according to the temperature difference and the mapping relationship, the system for adjusting the memory is further configured to:

acquire, according to the mapping relationship, a time difference between the actual time at which the data is written into the memory corresponding to the current temperature and the preset writing time; and adjust, according to the mapping relationship and the time difference, the equivalent width-length ratio to offset the time difference.

18. The semiconductor device of claim 16, wherein the preset range comprises a first preset range and a second preset range, and the second preset range is greater than the first preset range;

in response to the temperature difference exceeding the first preset range and not exceeding the second preset range, increasing or decreasing the equivalent width-length ratio, by a first preset value; and in response to the temperature difference exceeding the second preset range, increasing or decreasing the equivalent width-length ratio by a second preset value, wherein the second preset value is greater than the first preset value.

19. The semiconductor device of claim 14, wherein in acquiring the mapping relationship between the temperature of the transistor, the equivalent width-length ratio of the sense amplifier transistor in the sense amplifier, and the actual time at which the data is written into the memory, the system for adjusting the memory is further configured to:

acquire a first mapping relationship between the temperature of the transistor and the actual time at which the data is written into the memory;

acquire a second mapping relationship between the equivalent width-length ratio of the sense amplifier transistor in the sense amplifier and the actual time at which the data is written into the memory; and acquire, based on the first mapping relationship and the second mapping relationship, the mapping relationship between the temperature of the transistor, the equivalent width-length ratio of the sense amplifier transistor in the sense amplifier, and the actual time at which the data is written into the memory.

20. The semiconductor device of claim 14, wherein the sense amplifier transistor comprises an array of sense amplifier transistors arranged in parallel, and in adjusting the equivalent width-length ratio, the system for adjusting the memory is further configured to: adjust the equivalent width-length ratio of the sense amplifier transistor in the sense amplifier by adjusting a number of the sense amplifier transistors in the array connected to the sense amplifier.

* * * * *